(12) United States Patent
Kenkare et al.

(10) Patent No.: US 8,634,263 B2
(45) Date of Patent: Jan. 21, 2014

(54) INTEGRATED CIRCUIT HAVING MEMORY REPAIR INFORMATION STORAGE AND METHOD THEREFOR

(75) Inventors: Prashant U. Kenkare, Austin, TX (US); Troy L. Cooper, Austin, TX (US); Andrew C. Russell, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 370 days.

(21) Appl. No.: 12/433,330

(22) Filed: Apr. 30, 2009

(65) Prior Publication Data

US 2010/0277990 A1 Nov. 4, 2010

(51) Int. Cl.
*G11C 29/00* (2006.01)

(52) U.S. Cl.
USPC ...... 365/201; 365/200; 365/226; 365/189.09; 365/189.07; 365/211

(58) Field of Classification Search
USPC ........ 365/226, 200, 201, 189.09, 189.07, 211
See application file for complete search history.

(56) References Cited

U.S. PATENT DOCUMENTS

| | | | |
|---|---|---|---|
| 4,085,175 A | 4/1978 | Keuchel | |
| 5,159,571 A | 10/1992 | Ito et al. | |
| 5,298,816 A | 3/1994 | Kaplinsky | |
| 5,428,574 A | 6/1995 | Kuo et al. | |
| 5,430,679 A | 7/1995 | Hiltebeitel et al. | |
| 6,067,597 A * | 5/2000 | Kozaru | 711/100 |
| 6,272,670 B1 | 8/2001 | Van Myers et al. | |
| 6,335,900 B1 | 1/2002 | Kwon et al. | |
| 6,342,807 B1 * | 1/2002 | Nolan et al. | 327/525 |
| 6,373,758 B1 | 4/2002 | Hughes et al. | |
| 6,457,093 B2 * | 9/2002 | Roohparvar | 711/103 |
| 6,757,204 B2 * | 6/2004 | Di Ronza et al. | 365/200 |
| 6,765,428 B2 | 7/2004 | Kim et al. | |
| 6,788,566 B1 * | 9/2004 | Bhavnagarwala et al. | 365/154 |
| 6,791,864 B2 | 9/2004 | Houston | |
| 6,912,155 B2 * | 6/2005 | Sakurai et al. | 365/185.02 |
| 7,042,776 B2 | 5/2006 | Canada et al. | |
| 7,079,426 B2 | 7/2006 | Zhang et al. | |
| 7,085,175 B2 * | 8/2006 | Remington et al. | 365/189.09 |
| 7,181,564 B2 * | 2/2007 | Ajiro | 711/103 |
| 7,193,901 B2 | 3/2007 | Ruby et al. | |

(Continued)

OTHER PUBLICATIONS

Non-Published U.S. Appl. No. 11/847,424, filed with the US Patent Office on Aug. 30, 2007, first named inventor Matthew S. Berens.

(Continued)

*Primary Examiner* — Viet Q Nguyen
(74) *Attorney, Agent, or Firm* — Daniel D. Hill; James L. Clingan, Jr.

(57) ABSTRACT

A storage unit on an integrated circuit stores information that identifies a circuit on the integrated circuit, a selected operating condition, and a required operating configuration for the circuit for the selected operating condition. The manner of operating the circuit is changed to the required operating configuration in response to an operating condition of the circuit changing to the selected operating condition. This allows for efficiently identifying the few circuits that do not meet specified requirements based on a reduction in, for example, operating voltage, and altering their operation in order to meet the specified requirements relative to the reduced operating voltage without having to do so for the vast majority of the circuits that are able to meet the requirements at the lowered operating voltage.

17 Claims, 3 Drawing Sheets

(56) References Cited

U.S. PATENT DOCUMENTS

| | | | | |
|---|---|---|---|---|
| 7,215,176 | B2* | 5/2007 | Abe | 327/525 |
| 7,263,027 | B2* | 8/2007 | Kim et al. | 365/225.7 |
| 7,292,495 | B1* | 11/2007 | Kenkare et al. | 365/226 |
| 7,333,357 | B2* | 2/2008 | Houston | 365/154 |
| 7,333,385 | B2 | 2/2008 | Yamaoka et al. | |
| 7,411,815 | B2 | 8/2008 | Gogl | |
| 7,443,374 | B2 | 10/2008 | Hudson | |
| 7,502,275 | B2* | 3/2009 | Nii et al. | 365/226 |
| 7,542,369 | B2* | 6/2009 | Kenkare et al. | 365/226 |
| 7,570,525 | B2 | 8/2009 | Nii et al. | |
| 7,573,762 | B2* | 8/2009 | Kenkare et al. | 365/200 |
| 7,603,592 | B2 | 10/2009 | Sekiguchi et al. | |
| 7,613,052 | B2* | 11/2009 | Van Winkelhoff et al. | 365/189.09 |
| 7,660,150 | B2* | 2/2010 | Mikan et al. | 365/154 |
| 7,692,974 | B2* | 4/2010 | Amirante et al. | 365/189.04 |
| 7,701,755 | B2* | 4/2010 | Chen et al. | 365/154 |
| 7,733,686 | B2* | 6/2010 | Clinton | 365/154 |
| 7,793,172 | B2* | 9/2010 | Bruce et al. | 714/708 |
| 7,864,617 | B2* | 1/2011 | Kenkare | 365/226 |
| 7,903,483 | B2* | 3/2011 | Russell et al. | 365/200 |
| 8,004,907 | B2* | 8/2011 | Russell et al. | 365/189.011 |
| 8,009,500 | B2* | 8/2011 | Nii et al. | 365/226 |
| 8,063,650 | B2* | 11/2011 | Ong et al. | 324/750.3 |
| 8,315,117 | B2* | 11/2012 | Zhang et al. | 365/201 |
| 8,379,466 | B2* | 2/2013 | Zhang et al. | 365/200 |
| 2004/0153732 | A1 | 8/2004 | Kamata | |
| 2005/0036371 | A1 | 2/2005 | Kushida | |
| 2005/0138537 | A1 | 6/2005 | Worley | |
| 2006/0186935 | A1 | 8/2006 | Hwang et al. | |
| 2006/0239068 | A1 | 10/2006 | Boemler | |
| 2007/0025167 | A1 | 2/2007 | Ziegelmayer et al. | |
| 2007/0262890 | A1 | 11/2007 | Cornwell et al. | |
| 2007/0285986 | A1 | 12/2007 | Eguchi et al. | |
| 2008/0082873 | A1 | 4/2008 | Russell et al. | |
| 2008/0091990 | A1 | 4/2008 | Bruce et al. | |
| 2008/0172523 | A1 | 7/2008 | Tanaka et al. | |
| 2010/0208536 | A1 | 8/2010 | Deng et al. | |
| 2010/0259285 | A1* | 10/2010 | Koli et al. | 324/686 |

OTHER PUBLICATIONS

Wang et al; "Canary Replica Feedback for Near-DRV Standby Vdd Scaling in a 90nm SRAM"; IEEE 2007 Custom Integrated Circuits Conference, pp. 29-32.

Non-Published U.S. Appl. No. 12/164,755, filed with the US patent Office Jun. 30, 2008, first named inventor Shayan Zhang.

U.S. Appl. No. 12/275,622 Office Action—Rejection, dated Apr. 2, 2010.

U.S. Appl. No. 12/275,622 Office Action—Notice of Allowance, dated Sep. 17, 2010.

U.S. Appl. No. 12/275,622 Office Action—Notice of Allowance, dated Nov. 30, 2010.

U.S. Appl. No. 12/275,622 Office Action—Notice of Allowance, dated Jun. 2, 2011.

U.S. Appl. No. 12/414,758 Office Action—Rejection, dated Feb. 3, 2011.

U.S. Appl. No. 12/414,758 Office Action—Notice of Allowance, dated Jun. 6, 2011.

U.S. Appl. No. 12/414,758 Office Action—Notice of Allowance, dated Jul. 26, 2011.

U.S. Appl. No. 12/414,758 Office Action—Notice of Allowance, dated Nov. 3, 2011.

U.S. Appl. No. 12/414,758 Office Action—Rejection, dated Apr. 25, 2011.

U.S. Appl. No. 12/414,758 Office Action—Notice of Allowance, dated Sep. 27, 2011.

U.S. Appl. No. 12/414,761, office action—Notice of Allowance, mailed Jan. 13, 2012.

U.S. Appl. No. 12/414,761, Zhang, Shayan et al., "Integrated Circuit Memory Having Assisted Access and Method Therefor", filed Mar. 31, 2009, Office Action—Notice of Allowance, mailed Aug. 31, 2012.

U.S. Appl. No. 12/414,761, Zhang, Shayan et al., "Integrated Circuit Memory Having Assisted Access and Method Therefor", filed Mar. 31, 2009, Office Action—Notice of Allowance, mailed May 8, 2012.

U.S. Appl. No. 13/613,630, S. Zhang, "Methods for Testing A Memory Embedded In An Integrated Circuit", Office Action—Rejection, mailed Dec. 14, 2012.

U.S. Appl. No. 13/613,630, Inventor Zhang, Shayan, "Methods for Testing a Memory Embedded in an Integrated Circuit", filed Sep. 13, 2012, Office Action—Notice of Allowance, mailed May 10, 2013.

* cited by examiner

INTEGRATED CIRCUIT HAVING MEMORY REPAIR INFORMATION STORAGE AND METHOD THEREFOR

CROSS-REFERENCE TO RELATED APPLICATION(S)

This application is related to U.S. patent application Ser. No. 12/275,622, filed on Nov. 21, 2008, entitled "Integrated Circuit Having Memory with Configurable Read/Write Operations and Method Therefor", by Russell et al., and assigned to the current assignee hereof.

This application is related to U.S. patent application Ser. No. 12/414,758, filed on Mar. 31, 2009, entitled "Integrated Circuit Having an Embedded Memory and Method for Testing the Memory", by Zhang et al., and assigned to the current assignee hereof.

This application is related to U.S. patent application Ser. No. 12/414,761, filed on Mar. 31, 2009, entitled "Integrated Circuit Memory Having Assisted and Method therefor", by Zhang et al., and assigned to the current assignee hereof.

BACKGROUND

1. Field

This disclosure relates generally to integrated circuits, and more specifically, to an integrated circuit having memory repair information storage and method therefor.

2. Related Art

A common way to reduce power consumption in integrated circuits is to lower the power supply voltage. However, lowering the power supply voltage can cause an increased number of failures and unreliable operation in some circuits. For example, reducing the power supply voltage to a memory array can reduce read margins and cause the memory array to be more susceptible to soft errors and process variations. The problem is made worse as transistor sizes are decreased. On the other hand, the lower power supply voltage to the memory array can improve write margins. Therefore, in some implementations, the power supply voltage to the memory array is boosted during read operations and decreased during write operations. However, increasing and decreasing the array voltage as a way to improve read and write margins may cause increased power consumption.

Therefore, what is needed is a circuit and method that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, in one embodiment, there is provided, an integrated circuit having storage elements for storing repair information of both digital and analog circuits. The storage elements may include non-volatile storage elements having a plurality of bit fields that are re-configurable based on the type of module being repaired. The non-volatile storage elements may include fuses. The type of module may be, for example, an analog circuit module, a voltage regulator, a power management unit, a digital logic circuit, a memory circuit, a phase-locked loop (PLL), a clock distribution circuit, or the like. For a soft error in a memory, the repair information may include an identifier for identifying the module, a voltage identifier (VID) for identifying the power supply voltage, whether or not write or read assistance is used, address of location being repaired, and voltage magnitude of write/read assistance. A bit field interpretation (BFI) bit field stores the type of module being repaired. As used herein, "soft errors" are storage errors that are power supply voltage dependent. For example, a write error that occurs at one power supply voltage may not occur when the power supply voltage is lowered. Conversely, "hard errors" are storage errors that are not power supply voltage dependent. In the illustrated embodiment, the repair information is stored based on the power supply voltage stored in the VID bit field. For example, repair information for soft errors in a memory is stored based on the power supply voltage that causes the error.

In one aspect, there is provided, a method, comprising: storing in a storage unit on an integrated circuit information that identifies a circuit on the integrated circuit, a selected voltage from among at least three voltages, and required operating conditions for the circuit for the selected voltage; changing the manner of operating the circuit to the required operating conditions in response to an operating voltage of the circuit changing to the selected voltage. The method may further comprise: testing the circuit to identify the selected voltage as an operating voltage at which the circuit fails to operate according to a predetermined requirement; and identifying the required operating conditions as conditions under which the circuit will meet the predetermined requirement at the selected voltage. The step of storing may be further characterized by the storage unit comprising a one time programmable memory. The step of storing may be further characterized by the storage unit comprising a non-volatile memory. The step of storing may be further characterized by the circuit comprising a memory; and the step of changing may be further characterized by the required operating conditions comprising one of a group consisting of enabling a write assist and enabling a read assist. The step of changing may be further characterized as a write assist, wherein write assist comprises one of a group consisting of adjusting bit cell supply voltage, adjusting word line voltage, and adjusting bit line voltage. The step of storing may be further characterized as storing a magnitude of adjustment. The step of changing may be further characterized as a read assist, wherein read assist comprises one of a group consisting of adjusting bit cell supply voltage, adjusting bit line voltage, and adjusting word line voltage. The step of storing may be further characterized by the circuit comprising an analog circuit; and the step of changing may be further characterized by the required operating conditions comprising tuning parameters. The method may further comprise: storing in the storage unit circuit information that identifies a second circuit on the integrated circuit, a second selected voltage from among at least the three voltages, and required operating conditions for the second circuit for the second selected voltage; and changing the manner of operating the second circuit to the required operating conditions for the second circuit in response to an operating voltage of the second circuit changing to the second selected voltage. The step of storing in the storage unit circuit information that identifies a second circuit may be further characterized by the second circuit comprising one of a group consisting of a row and a column in a memory; and the step of changing the manner of operating the second circuit may be further characterized by the required operating conditions for operating the second circuit comprising one of a group consisting of enabling a write assist and enabling a read assist. The step of storing may be further characterized as identifying an interpretation of contents of the storage unit.

In another aspect, there is provided, an integrated circuit, comprising: a plurality of circuits; a storage unit that stores information that identifies a circuit of the plurality of circuits on the integrated circuit, a selected voltage from among at least three voltages, and required operating conditions for the circuit for the selected voltage; and a controller that changes the manner of operating the circuit to the required operating conditions in response to an operating voltage of the circuit changing to the selected voltage. The controller may be further characterized as reading the information in the storage unit prior to a change in the operating voltage. The storage unit may comprise one of a group consisting of a fuse bank, an electrically programmable fuse bank, a one time programmable memory, a read only memory, a non-volatile memory, a dynamic random access memory, a static random access memory, and a register bank. The plurality of circuits may comprise memories, rows of memories, columns of memories, and analog circuits. The circuit identified in the storage unit may comprise a row of a memory; and the required operating conditions identified in the storage unit may comprise one of a group consisting of enabling a read assist and enabling a write assist. The storage unit may further store circuit information that identifies a second circuit on the integrated circuit, a second selected voltage from among at least the three voltages, and required operating conditions for the second circuit for the second selected voltage; and the controller may change the manner of operating the second circuit to the required operating conditions for the second circuit in response to an operating voltage of the second circuit changing to the second selected voltage.

In yet another aspect, there is provided, a method, comprising: testing a plurality of circuits over a plurality of at least three operating voltages, wherein the circuits are on an integrated circuit and comprise one of a group consisting of a memory and a portion of a memory; identifying a first circuit of the plurality of circuits which fails to meet a predetermined requirement at one voltage of the at least three operating voltages under normal operating conditions; identifying special operating conditions for the first circuit at which the first circuit meets the predetermined requirement at the one voltage; storing in a storage unit on the integrated circuit information that identifies first circuit, the one voltage, and special operating conditions; and changing the manner of operating the first circuit to the special operating conditions in response to an operating voltage of the portion of the memory changing to the one voltage. The step of identifying the special operating conditions may comprise identifying one of group consisting of read assist and write assist.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a letter "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
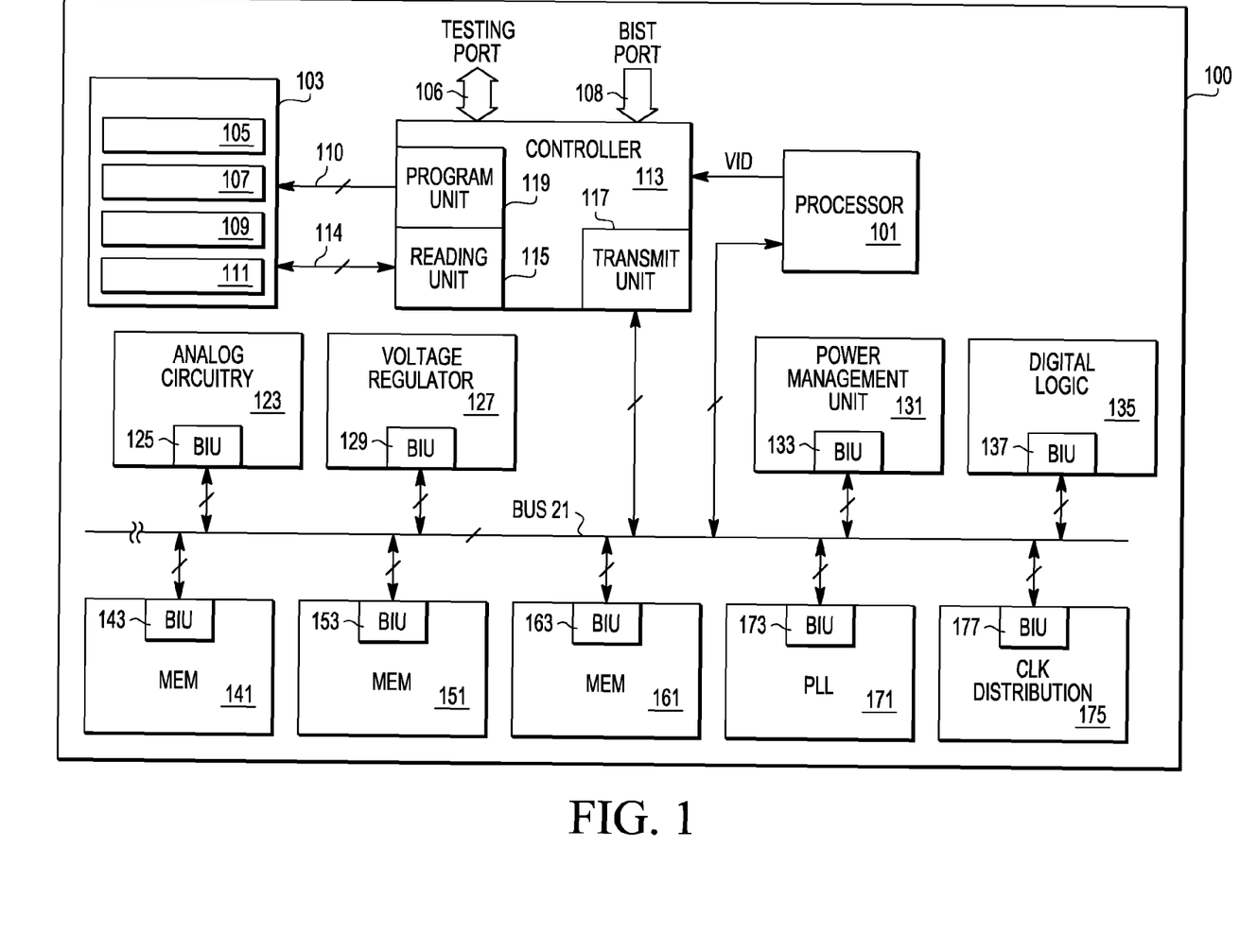
FIG. 1 illustrates, in block diagram form, an integrated circuit data processing system in accordance with an embodiment.

FIG. 1 illustrates, in block diagram form, an integrated circuit data processing system 100 in accordance with an embodiment. Integrated circuit 100 includes a processor 101, storage circuit 103, and a plurality of devices, or modules. Storage circuit 103 includes a plurality of storage elements 105, 107, 109, and 111. The devices, or modules, includes controller 113, analog circuitry 123, voltage regulator 127, power management unit 131, digital logic 135, memory 141, memory 151, memory 161, phase-locked-loop (PLL) 171, and clock distribution 175. All of the modules are coupled together via bus 21. Controller 113 includes program unit 119 for programming the storage elements of storage circuit 103 via lines 110, a reading unit 115 for reading the information stored in the storage circuit 103, and a transmit unit 117 for providing the information stored in storage circuit 103 to devices on bus 21. In the illustrated embodiment, each module includes a bus interface unit (BIU) for interfacing with bus 21. For example, analog circuitry 123 includes a BIU 125, voltage regulator 127 includes BIU 129, power management unit 131 includes BIU 133, digital logic 135 includes BIU 137, memory 141 includes BIU 143, memory 151 includes BIU 153, memory 161 includes BIU 163, PLL 171 includes BIU 173, and clock distribution 175 includes BIU 177. The plurality of storage elements 105, 107, 109, and 111 may include read only memory (ROM), electrically erasable programmable read only memory (EEPROM), flash EEPROM, one time programmable (OTP) memory, electrically blown fuse elements, laser blown fuse elements, and the like.

Controller 113 includes a testing port 106 and a Built-in Self Test (BIST) port 108 for testing the various modules of integrated circuit 100. Testing port 106 can be accessed externally using multiple approaches including scan. BIST port 108 may be controlled by on-chip BIST engines (not shown) used for testing either the memory array circuits or non-memory array circuits. For non-electrical fuse implementations, both ports may be used for validation of the repair solution prior to actual programming using the non-electrical means such as laser programming. For electrical fuse implementations, the test port 106 may be used for a non-automated approach that requires control external to integrated circuit 100. BIST port 108 may be used for providing programming information in an automated manner without external intervention. Such a use of BIST port 108 can also be referred to as self-programming.

In the illustrated embodiment, three memory array circuits 141, 151, and 161 are used to store information for the operation of the integrated circuit 100. Examples of memory array circuits may include SRAM memories, DRAM memories, and non volatile memories (e.g. Flash and MRAM). Such memory array circuits may be utilized as main memory, cache memory, or as boot up memory for integrated circuit 100 or for a system implementing integrated circuit 100. Memory array circuits 141, 151, and 161 utilize storage circuits 103 for implementing conventional redundancy for repairing hard and soft failures, or defects, in memory circuits 141, 151, and 161. The repair information includes memory locations (e.g. rows, columns, blocks, or bits) as replacement locations for defective locations of a memory array. The fuse information for repairing a defective memory array typically includes encoded addresses for identifying either defective columns or rows, and an enable signal which indicates that the defective column or row is to be replaced by a redundant column or row. Because only a small fraction of memory circuits are expected to require post-fabrication redundancy-based repair, it is desirable to have flexible usage of storage circuits 103 across the various modules of integrated circuit 100.

PLL 171 uses the storage circuits 103 for storing information for adjusting timing and tuning operating parameters of the PLL. Examples of such operating parameters include selection of a Voltage Controlled Oscillator (VCO) circuit, adjustment of clock pulse edges, adjusting internal capacitances, modifying filter parameters, changing device conductances, and definition of clock divider values.

Clock distribution circuit 175 utilizes storage circuit 103 for adjusting timing and tuning operating parameters such as programming clock generators distributed throughout integrated circuit 100 with a desired amount of delay. In some embodiments, a clock generator includes a multiplexer that allows a choice of predetermined delay values. The appropriate delay value is determined by the select signals to the multiplexer. These select signals can be controlled after fabrication using fuse information. Other uses of storage circuit 103 include balancing of clock trees by modification of parasitic loads or modification of device conductances.

Analog circuit 123 includes analog circuitry distributed throughout integrated circuit 100 that has circuitry (e.g. trimmable capacitor and resistors) that is programmable. Information used for the programmability includes adjustment of operating parameters such as tracking of voltage levels, magnitude of voltage levels and currents, resistance values, capacitance values, inductance values, and timing delays in order to improve performance or precision of the analog circuit.

Voltage regulator circuit 127 may include one or more voltage regulators. Voltage regulator circuit 127 uses storage circuits 103 to store information used for adjusting the regulated voltage provided by those regulators. In one embodiment, voltage regulator circuit 127 would adjust reference voltages provided to the voltage regulators.

Power management circuit 131 includes a BIU 133 for receiving fuse information from bus 21. Power management circuit 131 includes power management circuitry that controls system power consumption. Typically, this includes control of system operating voltage, system frequency, and the ability to change operating modes such that system power is minimized. In one embodiment, the operating modes could comprise power states that allow system units such as a floating point unit to be either partially or fully disabled in certain low power states. These operating parameters may potentially be modified after fabrication by fuse information in accordance with the illustrated embodiment.

Digital logic circuit 135 includes digital circuitry located in integrated circuit 100 that is programmable. In one embodiment, digital logic circuit 135 could be a microprocessor core that includes a processor, a level-1 cache, and a clock generation unit. The clock generation unit may comprise a phase locked loop (PLL). The storage circuits 103 may be used for modifying operating parameters of the digital circuit following fabrication. For example, redundancy information may be used for post-fabrication replacement of defective circuits with redundant logic and for selective adjustment of "keeper" sizes in dynamic logic blocks following fabrication.

In one embodiment, fuse information is programmed in fuse array circuit 103 after manufacture via programming unit 119 of controller 113. In one embodiment, programming unit 119 is coupled to either internal BIST (Built-in Self-Test) engines using BIST port 108 or to an external control unit through test port 106. As a result, there are multiple possible approaches for controlling programming unit 119 and the programmability of fuse array circuit 103.

In some embodiments, during start up (e.g. a power on reset), the information in storage circuit 103 is provided on bus 21 by transmit unit 117 in data unit sized increments (e.g. 2, 4, 8, 12, 14, 16, 24, 32, 64 bits). Each BIU includes an identification number. If the identification number matches a particular identifier field of the data unit sized increment, then BIU provides the information stored in storage circuit 103 in the remaining portion of the data unit to its respective circuitry for configurations of the circuits.

Other systems may have other configurations. For example, other storage circuits may include multiple fuses where the memory array circuits would be on one bus and the other circuits could be on other buses. In such an embodiment, controller 113 may have additional transmit units 117.

In accordance with the illustrated embodiment, a module, or circuit, of integrated circuit 100 is tested, and information that identifies the circuit and operating parameters for reliable operation are stored in one of storage elements 105, 107, 109, and 111. The operating parameters may include, for example, a selected voltage from among at least three voltages, location, type of module or circuit. In response to processor 101 commanding a different power supply voltage, the manner in which the circuit operates is changed in accordance with the stored selected voltage and the other operating parameters.

Figure 2:
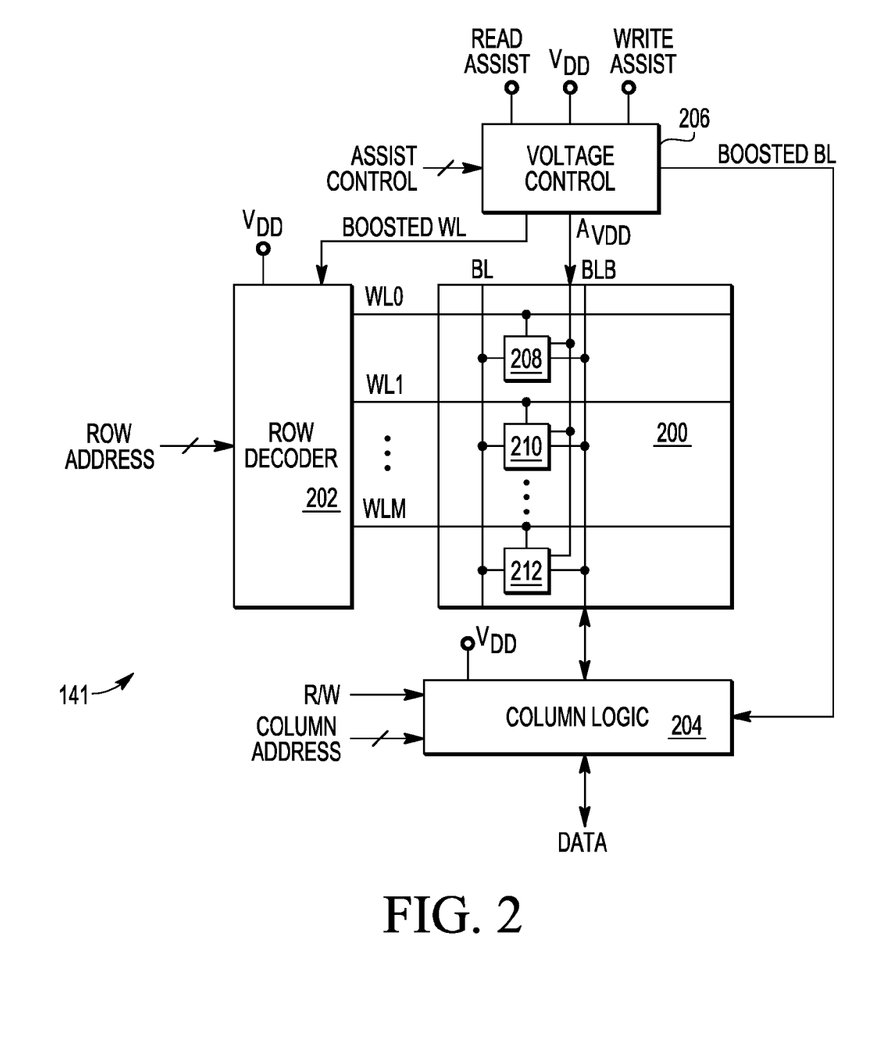
FIG. 2 illustrates, in block diagram form, one embodiment of a memory of FIG. 1.

FIG. 2 illustrates, in block diagram form, one embodiment of memory 141 of FIG. 1. Memory 141 includes memory array 200, row decoder 202, column logic 204, and voltage control circuit 206. Memory array 200 includes a plurality of memory cells, such as for example, memory cells 208, 210, and 212, organized in rows and columns. In the illustrated embodiment, memory array 200 is a conventional static random access memory (SRAM) array. A row includes a word line and all of the memory cells coupled to the word line. For example, one row includes word line WL0 and memory cells coupled to the word line. A column includes a bit line, or bit line pair, and all of the memory cells coupled to the bit line, or bit line pair. For example, one column includes bit line pair BL/BLB and memory cells 208, 210, and 212. In another embodiment, memory array 200 may include another type of volatile or non-volatile memory.

Row decoder 202 includes an input for receiving a multi-bit row address labeled "ROW ADDRESS", and an output coupled to each of the word lines. Row decoder 202 selects one of the word lines WL0-WLM in response to receiving a row address labeled "ROW ADDRESS". Note that in the illustrated embodiment, a row stores multiple cache lines or portions of different cache lines for processor 101. In another embodiment, a row may store a single cache line or a portion of a single cache line in which case a column address and column multiplexers would not be used. In a conventional memory, column logic 204 includes column multiplexers, sense amplifiers, bit line loads, write drivers, precharge and equalization circuits, and the like. Column logic 204 is coupled to each of the bit line pairs. During a read operation of memory 141, a control signal labeled "R/W" is asserted at a predetermined logic state, for example, a logic high, and a row address selects one of the word lines causing a stored logic state of each of the memory cells to be provided to a corresponding bit line pair in the form of a differential voltage. The column multiplexers of column logic 204 select one group of a plurality of column groups to couple to the sense amplifiers based on a column address labeled "COLUMN ADDRESS". For example, in one embodiment, a 4-to-1 column multiplexer may be implemented where one in four columns is selected by the column multiplexers for coupling to the sense amplifiers or write drivers. The sense amplifiers of column logic 204 sense and amplify the differential voltages and corresponding signals are output from column logic 204 as data signals labeled "DATA". A write operation is essentially the opposite of a read operation. That is, control signal R/W is negated as, for example, a logic low, and data signals DATA are provided via write drivers to memory cells coupled to a word line selected by the row address.

Voltage control 206 receives control signals "ASSIST CONTROL" and the power supply voltages "READ ASSIST", "WRITE ASSIST", AND "VDD". Voltage control 206 selectively provides a boosted wordline voltage labeled "BOOSTED WL" to row decoder 202, a boosted bit line voltage labeled "BOOSTED BL" to column logic 204, and an array power supply voltage labeled "AVDD". In response to receiving assist control signals "ASSIST CONTROL", the various voltages are provided by voltage control 206 to power memory 141. The ASSIST CONTROL signals are based on the entries of storage circuit 103. A voltage identifier (VID) is used by processor 101 to control the power supply voltage to the various modules of integrated circuit 100. In addition, voltage identifier VID is used by transmit unit 117 to transmit repair and tuning information to individual modules such as memory 141 and analog circuitry 123. This repair and tuning information is unique to the power supply voltage represented by a given value of VID. The repair and tuning information is determined during testing and stored in storage circuits 103. For example, the magnitude of the array voltage AVDD of memory 141 and also write and read assist voltages to row decoder 202 and column logic 204 are determined during testing and stored in storage circuits 103. Note that address, control, and data signals may be transmitted to and from memory 141 via BIU 143 and bus 21. In another embodiment, memory 141 may be accessed via a separate port (not shown).

In the illustrated embodiment, each memory cell of memory array 200 has a power supply voltage terminal coupled to receive array power supply voltage AVDD. It is desirable to operate the memory array with as low a power supply voltage as possible to reduce power consumption. In one embodiment, a "soft error" may be caused by operating the memory array at too low a power supply voltage. For example, in the case where memory array 200 is an SRAM array, reading a memory cell when the array power supply voltage is too low may cause the memory cell to unintentionally change logic states. Conversely, writing to a memory cell when the power supply voltage to the cell is too high may prevent the store logic state from changing. Several weak cells that are susceptible to soft errors may be detected during testing. If a processor commands a power supply voltage lower than the lowest voltage at which a memory cell will operate reliably during an access to the memory cell, an access assist voltage is provided to improve the write and/or read margin of the memory to make writing and/or reading of the memory easier and more reliable. The access assist may include one or more of an adjusted bit cell supply voltage, an adjusted bit line voltage, and an adjusted word line voltage. An entry of storage circuits 103 is used to store memory cell repair information specific for the particular power supply voltage at which the memory cell failed. Note that redundancy is first implemented in array 200 to correct for "hard errors" in the memory array. Hard errors can be opens, shorts, or other errors that prevent the memory cell from functioning regardless of the power supply voltage. In another embodiment, redundancy can be used for repairing voltage dependent bit cell errors. The read or write access assist would then be enabled only if redundancy does not correct the bit cell errors over the desired range of operating voltage.

Figure 3:
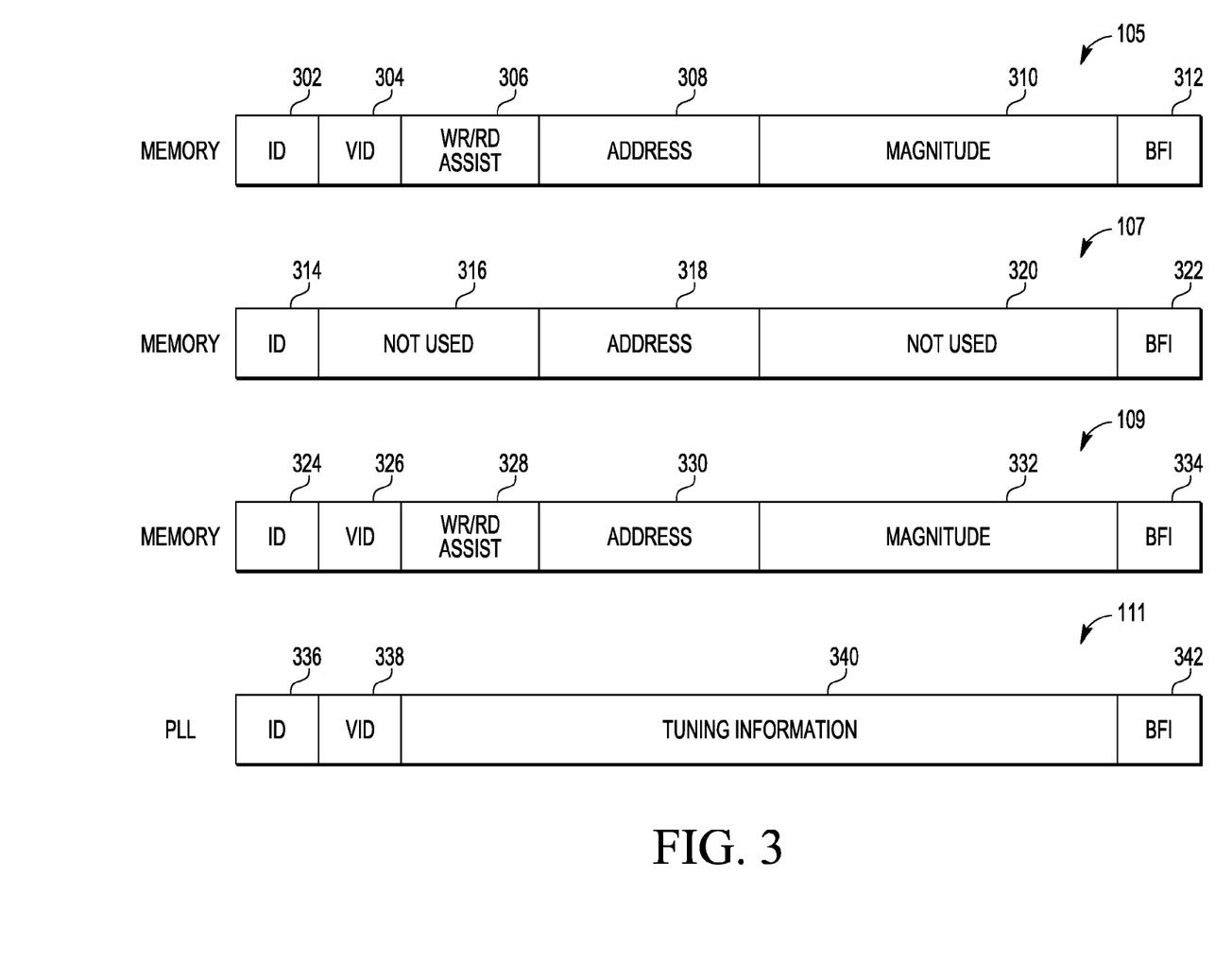
FIG. 3 illustrates, in block diagram form, one embodiment of the storage elements of FIG. 1.

FIG. 3 illustrates, in block diagram form, one embodiment of the storage elements 105, 107, 109, and 111 of storage circuits 103 of FIG. 1. As stated above, storage circuits 103 can be implemented using any type of non-volatile memory. In one embodiment, storage circuits 103 may be conventional electrically programmable fuses. Each of the storage elements of FIG. 3 can be configured to store repair and configuration information for any of the modules of integrated circuit 100. The repair and configuration information is stored depending on the lowest/highest power supply voltage at which the module will operate reliably. There may be more than one entry used for a module depending on the special conditions under which the module will operate. Also, in other embodiments, the storage elements, or units, may comprise another type of memory such as a one time programmable (OTP) memory, a ROM (read only memory), a non-volatile memory such as flash, a DRAM, an SRAM, a content addressable memory (CAM), or a register file having any of the above memory cell types.

The bit field boundaries of each of the storage elements are changed in response to a bit field interpretation bit field. For example, an analog circuit, such as a PLL, will require different information to be stored than, for example, a memory. Also, the different information may use a different number of bits. For example, repair information for implementing write/read assist in a memory will require a different number of bits and a different sized bit field than information required for a PLL. FIG. 3 illustrates one example of how the entries of storage elements 105, 107, 109, and 111 may be used. Storage examples for different memory repairs are illustrated with respect to storage elements 105, 107, and 109. A PLL example is illustrated with respect to storage element 111. In one example, memory 141 of FIG. 2 is tested during a part of the manufacturing process. During testing, a weak bit, that is, a bit that fails a read or write operation at a particular power supply voltage is detected. The controller 113 allocates an entry, for example, entry 105 to store the access assist information for the memory cell. Bit field 302 of entry 105 is used to store identification information (ID) regarding the specific module being repaired or configured. Each module's ID is different and unique to that module. Bit field 312, labeled "BFI" is used to store the bit field format of the module. Bit field 304 stores the VID of the power supply voltage at or below which the write or read assist is to be applied. Bit field 306 stores whether the memory repair is a write assist, a read assist, or both a write assist and read assist. Bit field 308 stores the address of the memory cell receiving the access assist. Bit field 310 stores the magnitude of the voltage used during the access assist. The storage area of entry 107 is formatted into bit fields for storing example redundancy information for a memory. Other embodiments may have a different format. Implementing redundancy only requires the memory ID and the address of the defective memory element being replaced (row or column). Bit field 314 is the ID bit field and bit field 318 is for the address. Bit field 322 stores the bit field boundaries. Note that implementing redundancy requires less information than implementing access assist and some bits of entry 107 are not used. For example bit fields 316 and 320 are not used in entry 107. In the illustrated embodiment, entry 109 includes bit fields 324, 326, 328, 330, 332, and 334. Entry 109 is also used to implement an access assist of a different memory unit of FIG. 1. In another embodiment, entry 109 may be used for a different module of FIG. 1. Entry 111 is used to illustrate an example of storing configuration information for PLL 171 based of voltage identifier VID. Bit field 336 stores the module ID for PLL 171. Bit field 338 stores the voltage identifier VID which identifies the operating voltage for which the tuning information in bit field 340 is relevant. Bit field 342 stores format information. Each of entries 105, 109, and 111 stores repair or configuration information based on the voltage identifier VID. Other embodiments may have a different number of storage elements. Also, different embodiments may store different information, may have a different number of bits or bit fields, and may have different bit field boundaries. For example, entry 107 could be organized in a more efficient manner which eliminates unused entries 316 and 320. In one embodiment, the bit fields of entry 107 could be configured to contain repair information for two different memories. In another embodiment, bit field 308 and/or bit field 312 of entry 105 may be encoded such that the entire memory identified by ID bit field 302 receives read and/or write assist while operating at the voltage identified by VID bit field 304. In yet another embodiment, other operating conditions, in addition to voltage, can be used to specify a circuit configuration. For example, environmental conditions such as temperature, frequency, power consumption, or other conditions such as number of operating cores can be encoded in a storage element bit field to specify a circuit configuration for that environmental condition. As an example, a temperature sensor may detect a change in temperature at which point controller 113 would scan the storage elements 103 for entries that specify different circuit configurations for the new temperature condition. Circuits would then be reconfigured for optimal operation at the new environmental condition. In general, any time an environmental condition that is encoded in the storage element bit fields changes, controller 113 scans storage elements 103 for entries that match the new environmental conditions.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method, comprising:
   storing in a storage unit on an integrated circuit information that identifies an analog circuit on the integrated circuit, a selected power supply voltage, and a required operating configuration comprising tuning parameters for the analog circuit, wherein the selected power supply voltage is selected from a first voltage below which the analog circuit may fail to operate reliably and a second voltage above which the analog circuit may fail to operate reliably; and changing the manner of operating the analog circuit with the required operating configuration in response to detecting that a power supply voltage supplied to the analog circuit is below the selected power supply voltage when the selected power supply voltage is the first voltage, or in response to detecting that the power supply voltage supplied to the analog circuit is above the selected power supply voltage when the selected power supply voltage is the second voltage.

2. The method of claim 1, further comprising:
testing the circuit to identify the selected power supply voltage as an operating voltage at which the circuit fails to operate according to a predetermined requirement; and identifying the required operating configuration as conditions under which the circuit will meet the predetermined requirement at the selected power supply voltage.

3. The method of claim 1, wherein:
the step of storing is further characterized by the storage unit comprising a one time programmable memory.

4. The method of claim 1, wherein:
the step of storing is further characterized by the storage unit comprising a non-volatile memory.

5. A method, comprising:
storing, in a storage unit on an integrated circuit, information that identifies a circuit on the integrated circuit, a selected operating condition, and a required operating configuration comprising information for the circuit for the selected operating condition, wherein the step of storing is further characterized by the circuit comprising a memory; and changing the manner of operating the circuit with the required operating configuration in response to detecting the selected operating condition, wherein the step of changing is further characterized by the required operating configuration as comprising one of a group consisting of enabling a write assist and enabling a read assist.

6. The method of claim 5, wherein the step of changing is further characterized as a write assist, wherein the write assist comprises one of a group consisting of adjusting bit cell supply voltage, adjusting word line voltage, and adjusting bit line voltage.

7. The method of claim 5, wherein the step of changing is further characterized as a read assist, wherein read assist comprises one of a group consisting of adjusting bit cell supply voltage, adjusting bit line voltage, and adjusting word line voltage.

8. The method of claim 1, wherein the step of storing is further characterized as storing a magnitude of adjustment.

9. The method of claim 1, further comprising:
storing in the storage unit circuit information that identifies a second circuit on the integrated circuit, a selected voltage from among at least the three voltages, and a required operating configuration for the second circuit for the selected voltage; and changing the manner of operating the second circuit to the required operating configuration for the second circuit in response to an operating voltage of the second circuit changing to the selected voltage.

10. The method of claim 9, wherein:
the step of storing in the storage unit circuit information that identifies a second circuit is further characterized by the second circuit comprising one of a group consisting of a row and a column in a memory; and the step of changing the manner of operating the second circuit is further characterized by the required operating configuration for operating the second circuit comprising one of a group consisting of enabling a write assist and enabling a read assist.

11. A method, comprising:
storing in a storage unit on an integrated circuit information that identifies an analog circuit on the integrated circuit, a selected operating condition, and a required operating configuration comprising tuning parameters for the analog circuit for the selected operating condition, wherein the selected operating condition comprises one of temperature, frequency, and power consumption; and changing the manner of operating the analog circuit with the required operating configuration in response to detecting the selected operating condition.

12. An integrated circuit, comprising:
a plurality of circuits;
a storage unit that stores information that identifies a circuit of the plurality of circuits on the integrated circuit, a selected voltage from among at least three voltages, and required operating conditions for the circuit, wherein the selected supply voltage is selected from a first voltage below which the circuit may fail to operate reliably and a second voltage above which the circuit may fail to operate reliably, and wherein the required operating conditions comprises one of temperature, frequency, and power consumption; and a controller that changes the manner of operating the circuit to the required operating conditions in response to detecting that an operating voltage of the circuit is below to the selected voltage when the selected supply voltage is the first voltage, or in response to detecting that the operating voltage of the circuit is above the selected supply voltage when the selected supply voltage is the second voltage.

13. The integrated circuit of claim 12, wherein:
the controller is further characterized as reading the information in the storage unit prior to the operating voltage changing to the selected voltage.

14. The integrated circuit of claim 12, wherein the storage unit comprises one of a group consisting of a fuse bank, an electrically programmable fuse bank, a one time programmable memory, a read only memory, a non-volatile memory, a dynamic random access memory, a static random access memory, and a register bank.

15. The integrated circuit of claim 12 wherein the plurality of circuits comprises memories, rows of memories, columns of memories, analog circuits, and digital logic circuits.

16. The integrated circuit of claim 12, wherein:
the circuit identified in the storage unit comprises a row of a memory; and the required operating conditions identified in the storage unit comprise one of a group consisting of enabling a read assist and enabling a write assist.

17. The integrated circuit of claim 12, wherein:
the storage unit further stores circuit information that identifies a second circuit on the integrated circuit, a second selected voltage from among at least the three voltages, and required operating conditions for the second circuit for the second selected voltage; and the controller changes the manner of operating the second circuit to the required operating conditions for the second circuit in response to an operating voltage of the second circuit changing to the second selected voltage.

* * * * *